(12) United States Patent
Fu et al.

(10) Patent No.: US 7,923,344 B2
(45) Date of Patent: Apr. 12, 2011

(54) METHOD OF FABRICATING BACKSIDE ILLUMINATED IMAGE SENSOR

(75) Inventors: Shih-Chi Fu, Taipei (TW); Gwo-Yuh Shiau, Hsinchu (TW); Liang-Lung Yao, Taipei (TW); Yuan-Chih Hsieh, Hsinchu (TW); Feng-Jia Shiu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/634,080

(22) Filed: Dec. 9, 2009

(65) Prior Publication Data

US 2010/0087029 A1    Apr. 8, 2010

Related U.S. Application Data

(62) Division of application No. 11/369,054, filed on Mar. 6, 2006, now Pat. No. 7,648,851.

(51) Int. Cl.
*H01L 31/18*    (2006.01)
(52) U.S. Cl. ........ 438/401; 438/459; 438/977; 257/797; 257/E23.179
(58) Field of Classification Search ................ 438/659, 438/5–13, 45, 16, 27, 65, 70, 115, 174, 181, 438/194, 231, 246–252, 276, 289, 301–306, 438/322, 369, 371–375, 418, 420, 433, 449, 438/495, 458, 514–534, 459, 626, 631, 633, 438/689–757, 759, 914–925, 934, 940, 959, 438/963, 975, 977, 978, FOR. 100–FOR. 134, 438/FOR. 370, FOR. 385–FOR. 406, FOR. 485; 257/797, E23.179, E31.058, E31.063, E31.115, E25.032, E27.133–E27.139, E21.135–E21.153
See application file for complete search history.

(56) References Cited

U.S. PATENT DOCUMENTS

| 4,154,632 | A | 5/1979 | Mochizuki et al. |
| 4,193,826 | A | 3/1980 | Mochizuki et al. |
| 4,199,386 | A | 4/1980 | Rosnowski et al. |
| 4,290,830 | A | 9/1981 | Mochizuki et al. |
| 4,507,674 | A | 3/1985 | Gaalema |

(Continued)

FOREIGN PATENT DOCUMENTS

JP    2005268738    9/2005

OTHER PUBLICATIONS

Chinese Patent Office, Office Action of Jun. 19, 2005, Application No. 2007101547453, 7 pages.

(Continued)

*Primary Examiner* — Hsien-ming Lee
*Assistant Examiner* — Walter H Swanson
(74) *Attorney, Agent, or Firm* — Haynes and Boone, LLP

(57) ABSTRACT

A method for fabricating a backside illuminated image sensor is provided. An exemplary method can include providing a substrate with a front surface and a back surface; forming a first alignment mark for global alignment on the front surface of the substrate; forming a second alignment mark for fine alignment in a clear-out region on the front surface of the substrate; aligning the substrate from the back surface using the first alignment mark; and removing a portion of the back surface of the substrate at the clear-out region for locating the second alignment mark.

20 Claims, 4 Drawing Sheets

U.S. PATENT DOCUMENTS

| | | |
|---|---|---|
| 4,760,031 A | 7/1988 | Janesick |
| 5,005,063 A | 4/1991 | Janesick |
| 5,244,817 A | 9/1993 | Hawkins et al. |
| 5,511,428 A | 4/1996 | Goldberg |
| 6,168,965 B1 | 1/2001 | Malinovich et al. |
| 6,169,319 B1 | 1/2001 | Malinovich et al. |
| 6,221,687 B1 | 4/2001 | Abramovich |
| 6,227,055 B1 | 5/2001 | Pitzer |
| 6,235,437 B1 | 5/2001 | Neoh et al. |
| 6,259,085 B1 | 7/2001 | Holland |
| 6,429,036 B1 | 8/2002 | Nixon et al. |
| 6,504,196 B1 | 1/2003 | Rhodes |
| 6,635,912 B2 | 10/2003 | Ohkubo |
| 6,765,276 B2 | 7/2004 | Fasen et al. |
| 6,821,809 B2 | 11/2004 | Abe et al. |
| 6,884,651 B2 | 4/2005 | Toyoda et al. |
| 6,946,352 B2 | 9/2005 | Yaung |
| 7,443,005 B2 | 10/2008 | Kuo et al. |
| 2001/0017344 A1 | 8/2001 | Aebi |
| 2002/0139990 A1 | 10/2002 | Suehiro et al. |
| 2004/0005729 A1 | 1/2004 | Abe et al. |
| 2004/0169625 A1 | 9/2004 | Park et al. |
| 2004/0178350 A1 | 9/2004 | Nagano et al. |
| 2005/0030399 A1 | 2/2005 | Suzuki et al. |
| 2005/0090035 A1 | 4/2005 | Kim |
| 2005/0250292 A1* | 11/2005 | Baluswamy et al. ......... 438/401 |
| 2005/0274968 A1 | 12/2005 | Kuo et al. |
| 2006/0012001 A1 | 1/2006 | Kim |
| 2006/0023109 A1 | 2/2006 | Mabuchi et al. |
| 2006/0038209 A1 | 2/2006 | Hashimoto |
| 2006/0057759 A1 | 3/2006 | Zhang et al. |
| 2006/0121640 A1 | 6/2006 | Kim |
| 2006/0197171 A1 | 9/2006 | Zhang et al. |
| 2006/0267123 A1 | 11/2006 | Wu et al. |
| 2006/0275941 A1 | 12/2006 | Oliver et al. |
| 2007/0001100 A1 | 1/2007 | Hsu et al. |
| 2007/0117253 A1 | 5/2007 | Hsu et al. |
| 2007/0207566 A1 | 9/2007 | Fu et al. |

OTHER PUBLICATIONS

Williams, George M., "Back-Illuminated CCD Imagers for High Information Content Digital Photography", SPIE, vol. 3302, Apr. 1998, pp. 39-53.

* cited by examiner

METHOD OF FABRICATING BACKSIDE ILLUMINATED IMAGE SENSOR

CROSS-REFERENCE

This application is a divisional of U.S. patent application Ser. No. 11/369,054, filed Mar. 6, 2006, now U.S. Pat. No. 7,648,851, issued Jan. 19, 2010, the entire disclosure of which is incorporated herein by reference.

BACKGROUND

An image sensor provides a grid of pixels, such as photosensitive diodes or photodiodes, reset transistors, source follower transistors, pinned layer photodiodes, and/or transfer transistors for recording an intensity or brightness of light. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor (CIS).

Back-side illuminated sensors are used for sensing a volume of exposed light projected towards the backside surface of a substrate. The pixels are located on a front side of the substrate, and the substrate is thin enough so that light projected towards the backside of the substrate can reach the pixels. Back-side illuminated sensors provide a high fill factor and reduced destructive interference, as compared to front-side illuminated sensors.

A problem with back-side illuminated sensors is that in order to successfully process the backside of the wafer, a reticle pattern for a particular device layer must be correctly aligned to an existing pattern on the front side of the wafer. Alignment is the process of determining the position, orientation, and distortion of the patterns already on the wafer and then placing them in correct relation to the projected image from the reticle. Alignment marks are visible patterns placed on the reticle and the wafer to determine their position and orientation. However, alignment marks formed on the front side of the wafer are difficult to detect and align with conventional tools when patterning the backside of the wafer for processing. Improvements in alignment methods are desired to accurately and precisely pattern and process back-side illuminated sensors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
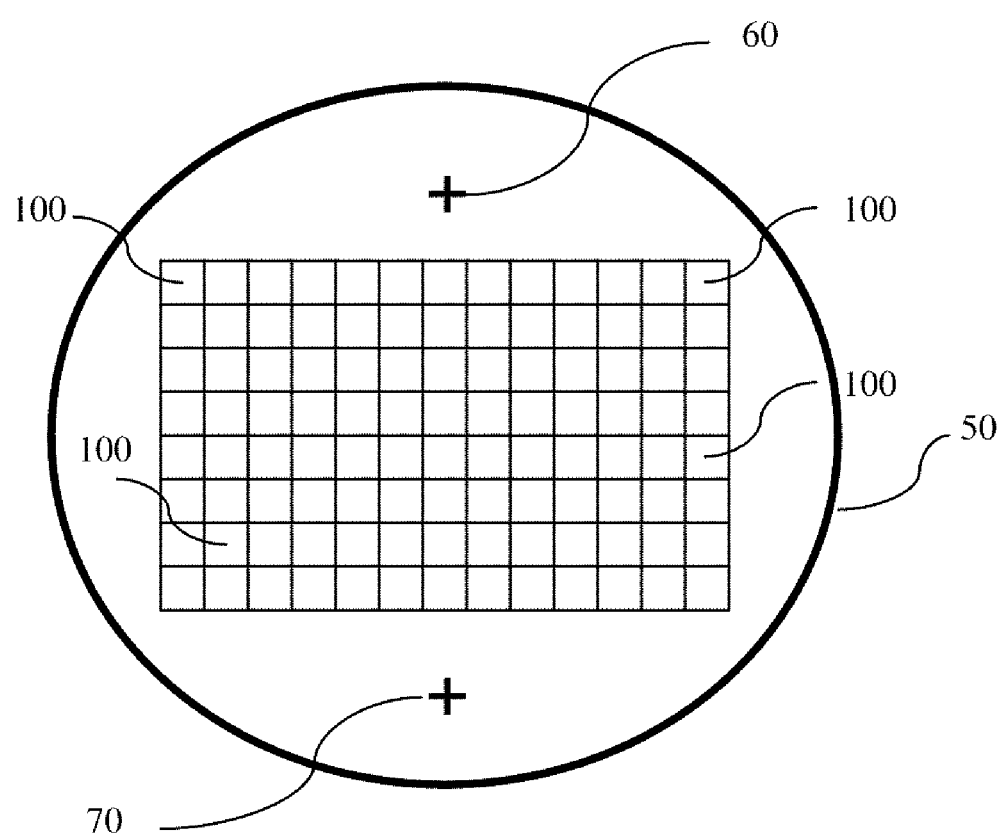
FIG. 1 is a top view of a wafer including a circuit design pattern for a back-side illuminated image sensor.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a wafer 50 provides a plurality of circuit designs 100 for a back-side illuminated image sensor. The circuit design 100 includes a plurality of transistors, metal interconnects, metal contacts, metal pads, and other circuitry that provide an operation environment for the sensor and for supporting external communications with the sensor.

The wafer 50 includes alignment marks 60, 70 formed on a front side of the wafer. The marks 60, 70 may be printed on the wafer 50 surface during photolithography of a 1× reticle and in conjunction with a process that forms non-critical patterning layers. As an example, a photoresist layer is applied to the wafer 50. The photoresist is exposed using the 1× reticle and is subject to a patterning process. An etching process is performed on the wafer 50 to form the alignment marks 60, 70. Since the reticle is 1×, the alignment marks 60, 70 have the same dimension as the marks that were patterned on the reticle. The marks 60, 70 may be used for making coarse alignments of the wafer 50 during subsequent patterning steps. Even though two alignment marks on opposite sides of the wafer are shown in FIG. 1, it is understood that the number and arrangement of the alignment marks may vary.

Figure 2:
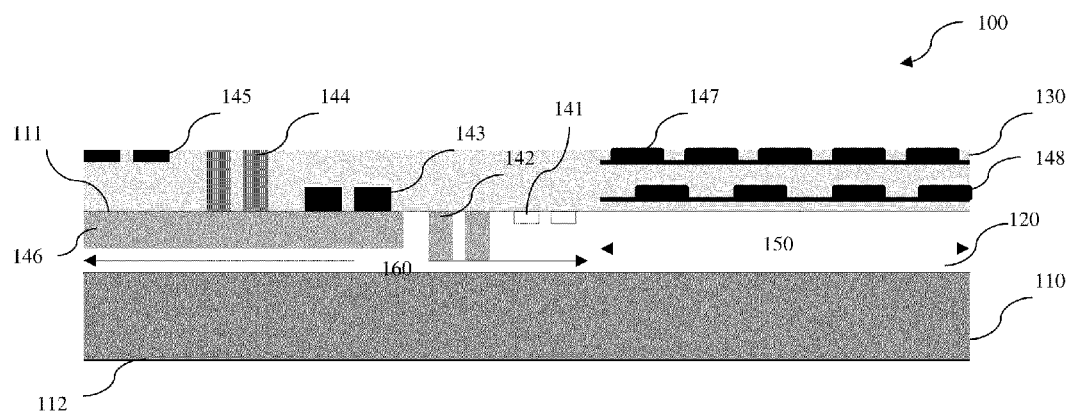
FIGS. 2-7 are sectional views of a back-side illuminated color image sensor being constructed according to one or more embodiments of the present disclosure.

Now referring to FIG. 2, the circuit design 100 is formed on a silicon substrate (also referred to as a wafer, such as the wafer 50) 110. Alternatively, the substrate 110 may comprise an elementary semiconductor such as germanium and diamond. The substrate 110 may also comprise a compound semiconductor, such as silicon carbide, gallium arsenic, indium arsenide, and indium phosphide. Also, semiconductor arrangements such as silicon-on-insulator (SOI) can be provided. The substrate 110 may comprise an alloy semiconductor, such as silicon germanium, silicon germanium carbide, gallium arsenic phosphide, and gallium indium phosphide.

In the present embodiment, the substrate 110 comprises a heavily doped P-type silicon. Silicon doping may be implemented using a process such as ion implantation or diffusion in various steps. A silicon epitaxial layer (epi layer) 120 is grown on the substrate 110 by a method such as chemical vapor deposition (CVD). The epi layer 120 has a lower concentration of dopant than that of the heavily doped P-type silicon substrate 110. Together, the substrate 110 and epi layer 120 form a front 111 and back 112 surface.

In the depicted embodiment, metal interconnect structures 147, 148 are formed on the front surface 111 of the substrate 110. The metal interconnect structures 147, 148 may include transistors, metal interconnects, metal contacts, metal pads, other circuitry. The metal interconnect structures 147, 148 are provided in a silicon dioxide insulating layer 130. The oxide layer 130 is deposited by a method such as chemical vapor deposition (CVD). Even though FIG. 2 shows one oxide layer 130, there may be multiple oxide layers that serve as an insulating material between each metal layer or between a first metal layer and the substrate 110. The substrate 110 may further comprise lateral isolation features, such as a shallow trench isolation (STI) 146 structure to separate different devices formed on the substrate. It is understood that conventional processes and equipment are used to fabricate the metal interconnect structures 147, 148. However, certain structures corresponding to an active region 150 of a pixel have been reserved until processing the backside of the substrate (or wafer) 110 and will be discussed later in FIGS. 6 and 7.

The circuit design 100 further includes alignment marks that have been formed on the front surface 111 during photolithography of a 4× reticle when pattering for the metal interconnect structures 147, 148. Alignment marks may be one or more lines on the 4× reticle which become trenches when printed on the wafer. Alternatively, the marks may be a shape on the 4× reticle which overlays already existing marks on the circuit design 100. As an example, a photoresist layer is applied to the wafer. The photoresist is exposed using the 4× reticle and is subject to a patterning process. An etching process is performed on the wafer to form the alignment marks. Since the reticle is 4×, the marks formed on the wafer arc ¼ the size of the marks that were patterned on the reticle. These marks may he used to make final alignment adjustments between each wafer exposure site and a subsequent reticle and, thus, allows for accurate and precise processing of critical layers in the circuit design 100. It is understood that other types of reticles such as 5× or 10× may be used to form the alignment marks.

For the sake of example, the alignment marks may be formed within a clear-out region 160 of the epi layer 120, either on a surface 141 or in deep trenches 142. Alternatively, the alignment marks may comprise polysilicon 143 structures or metal contacts 144 or metal pads 145 that have been formed adjacent to/above the shallow trench isolation (STI) 146 structure within the clear-out region 160. The deep trenches 142 and STI 146 structures may be filled with an insulating oxide. All the alignment marks comprising 141, 142, 143, 144, 145 are shown next to each other in FIG. 2 for the purpose of simplicity and clarity. Any combination or arrangement of alignment marks may be used and will depend on the circuit design 100 formed on the wafer.

Figure 3:
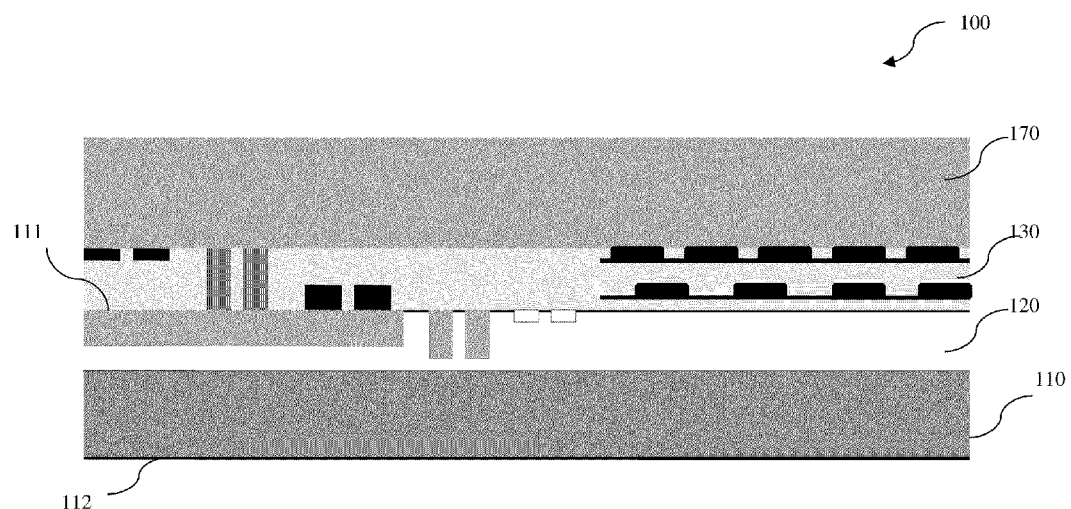

Referring now to FIG. 3, a supporting material layer 170 is bonded to the front surface 111 of the substrate 110 by an adhesive. The supporting layer 170 may comprise a transparent glass or silicon wafer.

Figure 4:
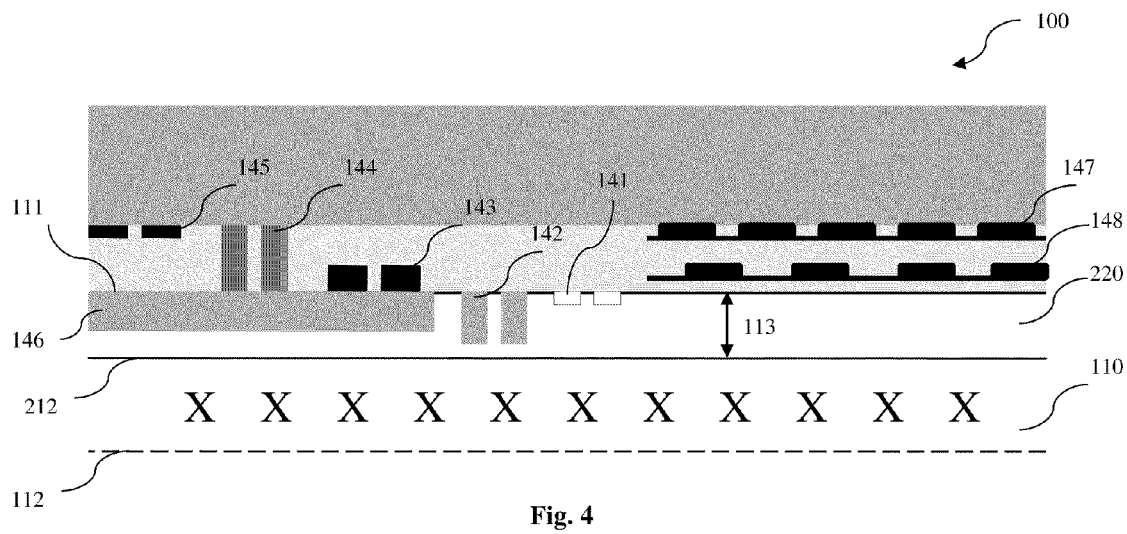

Referring now to FIG. 4, the substrate 110 may be thinned and polished from the back surface 112 until a thickness 113 is remaining for the substrate. The thickness may be about of about 4 µm. This reduction in thickness may be accomplished by back grinding, diamond scrubbing, chemical mechanical planarization (CMP), or other similar techniques. The thinning process leaves a silicon substrate (also referred to as wafer) 220 with a new back surface 212 for further processing.

The alignment marks 141, 142, 143, 144, 145 formed on the front surface 111 of the substrate (or wafer) 220 cannot be optically detected with conventional tools (e.g., ASML or KLA) when performing registration (alignment) from the back surface 212 of the wafer. Therefore, silicon material that covers the alignment marks 141, 142, 143, 144, 145 within a clear-out region 160 of the substrate 220 is removed by a selective etch process.

Figure 5:
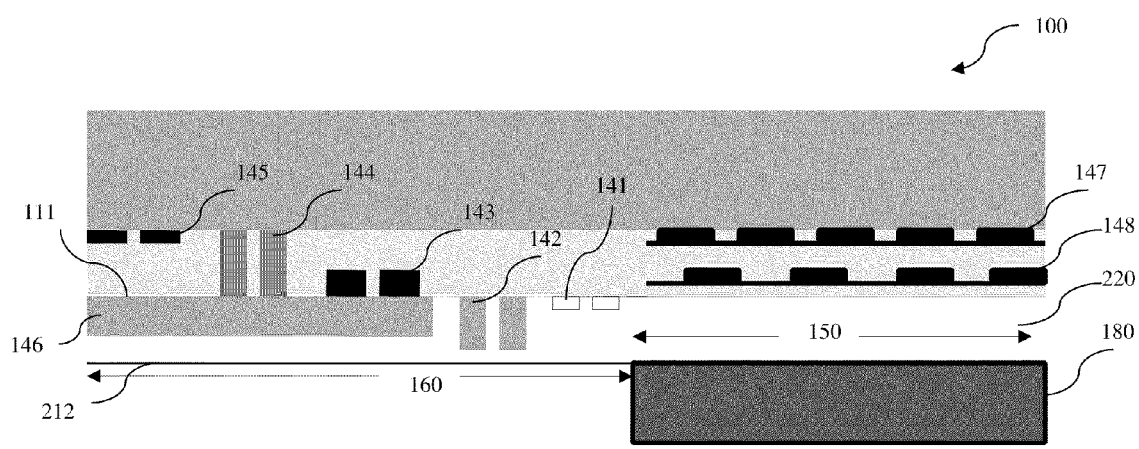

Referring now to FIG. 5, a photoresist mask 180 is developed over the active region 150 of a pixel leaving the clear-out region 160 where the alignment marks 141, 142, 143, 144, 145 are located unmasked. This can be done by performing registration from the back surface 212 with the alignment marks 60, 70 (FIG. 1) formed on the front surface 111 of the substrate (or wafer) 220 (e.g., wafer 50). Because the alignment marks 60, 70 were previously formed by a 1× reticle, the marks can be optically detected and aligned by conventional tools and are adequate for patterning the back surface 212 to produce the photoresist mask 180.

As an example, a photoresist layer is applied to the back surface 212 of the substrate (or wafer) 220. A 1× reticle containing a desired pattern and alignment marks may be aligned with the existing alignment marks 60, 70 on the wafer. Since the 1× reticle is used to pattern the back surface 212 of the wafer, the alignment marks on the 1× reticle are mirror images of the alignment marks 60, 70 formed on the front surface of the wafer. An alignment system illuminates (e.g., infrared or visible light) the alignment marks 60, 70 and performs registration with the 1× reticle by projecting light through the 1× reticle alignment marks and onto the back surface 212 of the wafer. The alignment system employs photo detectors to optically detect the 1× reticle marks and the alignment marks 60, 70 on the wafer. The alignment system makes adjustments to align the wafer and the 1× reticle based on position data measured by the photo detectors.

Once aligned, the photoresist layer is exposed using the 1× reticle and is subject to a patterning process. The patterning process forms the photoresist mask 180, which covers the active region 150 reserved for further processing and leaves uncovered the clear-out region 160. The silicon material within the clear-out region 160 may be removed by a selective chemical etch process. Since the active region 150 is covered by the photoresist mask 180, the selective etch process only removes the silicon material within the clear-out region 160. After removal of the silicon, the photoresist mask 180 protecting the active region is removed and the clear-out region 160 is leveled by filling the region with an organic material. The organic material may be a photoresist material, either a positive or negative-type photoresist.

Figure 6:
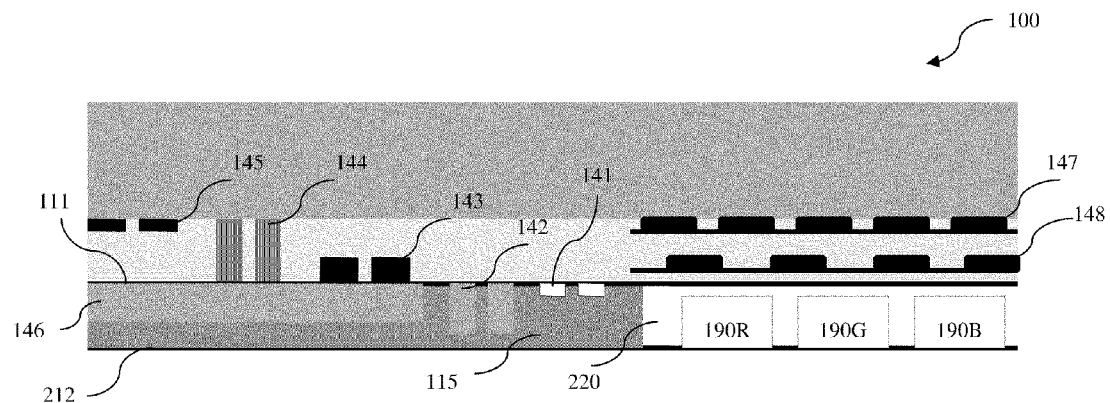

Referring now to FIG. 6, the substrate 220 now includes the active region 150 comprising a lightly doped P-type silicon and the clear-out region 160 comprising the photoresist 115 filler material. The photoresist 115 filler material may be used as a mask when processing the active region 150 from the back surface 212. Because the silicon material was removed from the clear-out region 160, registration performed from the back surface 212 with the alignment marks 141, 142, 143, 144, 145 is now possible with conventional tools to accurately and precisely pattern the active region 150 of the substrate 220.

As an example, a photoresist layer is applied to the back surface 212 of the substrate (or wafer) 220. A 4× reticle containing a desired pattern and alignment marks may be aligned with the existing alignment marks 141, 142, 143, 144, 145 which were formed during processing of the front surface 111. Since the 4× reticle is used to pattern the back surface 212 of the wafer, the marks on the 4× reticle are minor images of the alignment marks 141, 142, 143, 144, 145 formed on the front surface 111. Alternatively, the marks on the 4× reticle may be mirror image type shapes that overlay on the existing alignment marks 141, 142, 143, 144, 145, such as a box-in-box configuration. An alignment system illuminates (e.g., infrared or visible light) the alignment marks 141, 142, 143, 144, 145 and performs registration with the 4× reticle by projecting light through the 4× reticle alignment marks and onto the back surface 212 of the substrate (or wafer) 220. The alignment system employs photo detectors to optically detect the 4× reticle alignment marks and the alignment marks 141, 142, 143, 144, 145 formed on the circuit design 100. The alignment system makes adjustments to align the wafer and the 4× reticle based on position data measured by the photo detectors. These marks may be used to make final alignment adjustments between each wafer exposure site and the 4× reticle and, thus, allows for accurate and precise patterning of a junction implant, color filter, and microlens for a pixel in the active region 150 as discussed below. It is understood that other types of reticles such as 5× or 10× may be used to pattern the back-side of the substrate (or wafer) 220 and will depend on the type of reticle that was used to form the alignments marks 141, 142, 143, 144, 145 on the front side.

In the present embodiment, the circuit design 100 includes a plurality of pixels. The pixels each comprise a light-sensing region (or photo-sensing region) which in the present embodiment is an N-type doped region having dopants formed in the active region 150 of the substrate 220 by a method such as diffusion or ion implantation. In continuance of the present example, the doped regions are further labeled 190R, 190G, and 190B to correspond with the pixels representing red, green, and blue light, respectively. In some embodiments, the doped regions 190R, 190G, 190B can be varied one from another, such as by having different junction depths, thicknesses, and so forth. It is understood that the wavelengths red, green, and blue are provided for the sake of example, and that the pixels are generally illustrated as being photodiodes for the sake of example. Other pixel types include reset transistors, source follower transistors, pinned layer photodiodes, and transfer transistors.

Figure 7:
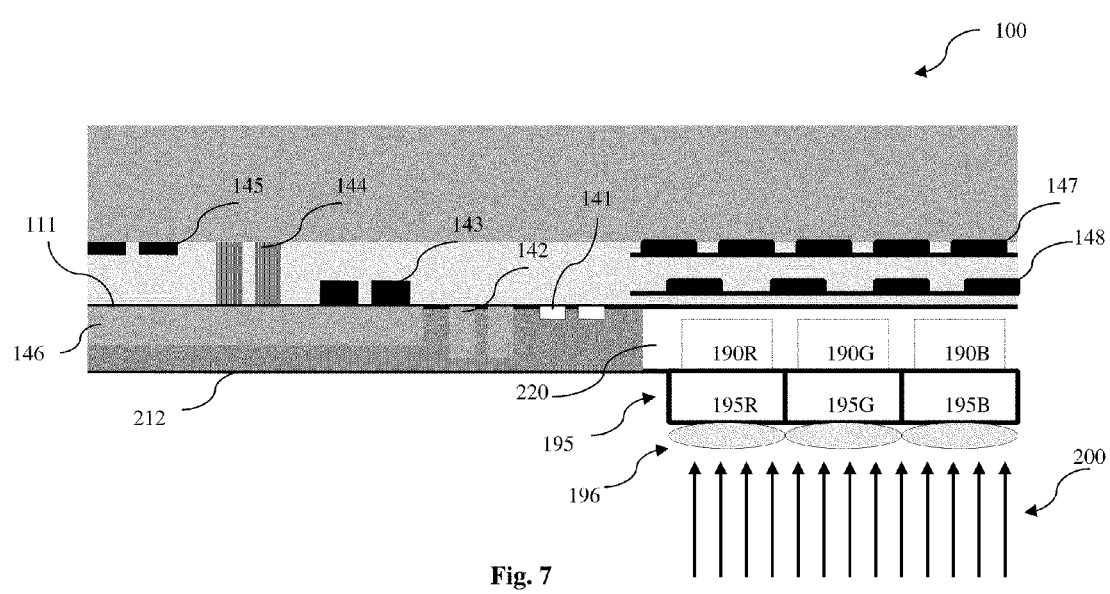

Referring now to FIG. 7, the circuit design 100 further comprises a color filter layer 195. The color filter layer 195 can support several different color filters (e.g., red, green, and blue), and may be positioned such that the incident light is directed thereon and there through. In one embodiment, such color-transparent layers may comprise a polymeric material (e.g., negative photoresist based on an acrylic polymer) or resin. The color filter layer 195 may comprise negative photoresist based on an acrylic polymer including color pigments. In continuance of the present example, color filters 195R, 195G, and 195B correspond to pixels with doped regions 190R, 190G, and 190B, respectively.

The circuit design 100 may comprise a plurality of lenses 196, such as microlenses, in various positional arrangements with the pixels and the color filters 195, such that the back-side-illuminated light 200 can be focused on the light-sensing regions.

The circuit design 100 is designed to receive light 200 directed towards the back-side of the substrate 220 during applications, eliminating any obstructions to the optical paths by other objects such as gate features and metal interconnects 147, 148 and maximizing the exposure of the doped (light-sensing) regions 190R, 190G, and 190B to the illuminated light. The illuminated light 200 may not be limited to visual light beam, but can be infrared (IR), ultraviolet (UV), and other radiation.

Thus, provided is a method for fabricating a back-side illuminate image sensor. In one embodiment, the method includes providing a semiconductor substrate having a front surface, back surface, and clear-out region, providing a plurality of transistors, metal interconnects, and metal pads on front surface of the substrate, bonding a supporting layer to the front surface of the substrate, thinning-down the semiconductor substrate from the back surface, clearing-out a region of the semiconductor substrate from the back surface that covers a fine alignment mark by performing registration from the back surface and using a global alignment mark as a reference, and processing the back surface of the substrate by performing registration from the back surface and using the fine alignment mark as a reference. In some embodiments, the semiconductor substrate is a silicon. In other embodiments, the semiconductor substrate is a silicon-on-insulator (SOI) arrangement. In other embodiments, the semiconductor substrate is an eptaxial silicon arrangement.

In some embodiments, the global alignment mark is formed on the front surface of the substrate by at least a 1× reticle pattern. In other embodiments, the fine alignment mark is formed on the front surface by at least a 4× reticle pattern. The fine alignment mark is a mirror-image type alignment or overlay mark. In some embodiments, the fine alignment mark comprises a metal contact adjacent to a shallow trench isolation structure. In other embodiments, the second alignment mark comprises a metal pad. In other embodiments, the fine alignment mark comprises a deep trench. In still other embodiments, the fine alignment mark comprises a polysilicon structure adjacent to a shallow trench isolation structure.

In some embodiments, the supporting layer is a transparent glass and performing registration from the back surface is by using infrared light through the transparent glass and optically aligning the fine alignment mark with a mirror-image type reticle pattern. In other embodiments, the supporting layer is a silicon wafer and performing registration from the back surface is by using visible light through the silicon wafer and optically aligning the fine alignment mark with a mirror-image type reticle pattern.

In some embodiments, the method further comprises filling and leveling the cleared-out region of the substrate with an organic material. In some embodiments, the organic material is a positive photoresist. In other embodiments, the organic material is a negative photoresist.

In another embodiment, a method for fabricating a backside illuminated image sensor includes providing a semiconductor substrate having a front surface, back surface, active region, and clear-out region, forming a first alignment mark on the front surface of the substrate, and forming a second alignment mark on the front surface of the clear-out region. The method further includes bonding a supporting layer to the front surface of the substrate, thinning the semiconductor substrate from the back surface, selectively etching a portion of the substrate within the clear-out region by performing registration from the back surface and using the first alignment mark as a reference, and processing the active region of the substrate by performing registration from the back surface and using the second alignment mark as a reference. Processing the active region includes forming a first, second, and third doped region within the active region, forming a red, green, and blue color filter on the back surface and aligned with the first, second, and third doped region, respectively, and forming a microlens over the color filter. In some embodiments, performing registration from the back surface of the substrate is by using radiation through the supporting layer and optically detecting and aligning the second alignment mark with an alignment mark a reticle. In some embodiments, the alignment mark on the reticle is a mirror-image of the second alignment mark. In other embodiments, the alignment mark on the reticle is a minor-image shape that overlays on the second alignment mark.

In another embodiment, a method of fabricating an electronic device includes providing a substrate with a front surface and a back surface, forming a first alignment mark for global alignment on the front surface of the substrate, forming a second alignment mark for fine alignment in a clear-out region on the front surface of the substrate, aligning the substrate from the back surface using the first alignment mark, and after aligning, removing a portion of the back surface of the substrate at the clear-out region for locating the second alignment mark. In some embodiments, the method further includes adding a supporting layer to the front surface of the substrate. In some embodiments, the method further includes reducing a thickness of the substrate prior to aligning the substrate. In other embodiments, the first alignment mark is formed by a 1× reticle pattern. In still other embodiments, the second alignment mark is a minor-image type alignment or overlay mark formed by a 4× reticle pattern.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating an electronic device, comprising:
   providing a substrate with a front surface and a back surface;
   forming a first alignment mark for global alignment on the front surface of the substrate;
   forming a second alignment mark for fine alignment in a clear-out region on the front surface of the substrate; and
   removing a portion of the back surface of the substrate at the clear-out region tor locating the second alignment mark, wherein the removing includes performing registration from the back surface using the first alignment mark as a reference.

2. The method of claim 1, further including adding a supporting layer to the front surface of the substrate.

3. The method of claim 1, further including reducing a thickness of the substrate prior to removing the portion of the back surface.

4. The method of claim 1 wherein forming the first alignment mark includes forming the first alignment mark by a 1× reticle pattern.

5. The method of claim 1 wherein forming the second alignment mark includes forming a mirror-image type alignment mark or an overlay mark.

6. The method of claim 1 wherein forming the second alignment mark includes forming the second alignment mark by a 4× reticle pattern.

7. The method of claim 1 wherein removing the portion of the back surface is performed after performing registration.

8. The method of claim 7 wherein removing the portion of the back surface includes performing a selective etching process.

9. The method of claim 1 wherein the performing the registration from the back surface using the first alignment mark as the reference includes aligning the first alignment mark with an alignment mark of a reticle.

10. The method of claim 1, further including aligning the substrate from the back surface using the second alignment mark.

11. The method of claim 10, further including:
    forming a doped region within an active region of the substrate; and
    forming a color filter and a mircolens on the back surface of the substrate and aligned with the doped region.

12. A method for fabricating a back-side illuminated image sensor, comprising:
    providing a semiconductor substrate having a front surface, back surface, active region, and clear-out region;
    forming a first alignment mark on the front surface of the substrate;
    forming a second alignment mark on the front surface in the clear-out region;
    selectively etching a portion of the substrate from the back surface within the clear-out region by performing registration from the back surface and using the first alignment mark as a reference; and
    processing the active region of the substrate from the back surface by performing registration from the back surface and using the second alignment mark as a reference.

13. The method of claim 12 wherein performing registration from the back surface of the substrate includes using radiation and optically detecting and aligning one of the first and second alignment marks with an alignment mark on a reticle pattern.

14. The method of claim 13 wherein the alignment mark on the reticle pattern is a mirror-image of one of the first and second alignment marks.

15. The method of claim 12 wherein the alignment mark on the reticle pattern is a minor-image shape that overlays one of the first and second alignment marks.

16. The method of claim 12 wherein forming the first alignment mark includes forming the first alignment mark by a 1× reticle pattern.

17. The method of claim 12 wherein forming the second alignment mark includes forming the second alignment mark by a 4× reticle pattern.

18. The method of claim 12 further including forming a supporting layer over the front surface of the substrate.

19. The method of claim 12 further including thinning the semiconductor substrate from the back surface prior to selectively etching the portion of the substrate from the back surface within the clear-out region.

20. The method of claim 12 wherein processing the active region of the substrate from the back surface includes:
    forming first, second, and third doped regions within the active region of the substrate;
    forming first, second, and third color filters on the back surface of the substrate and aligned with the first, second, and third doped regions, respectively; and
    forming a microlens over the first, second, and third color filters.

* * * * *